United States Patent [19]

Honda et al.

[11] Patent Number: 4,755,026
[45] Date of Patent: Jul. 5, 1988

[54] MAGNETOOPTIC GARNET
[75] Inventors: Yoichi Honda, Miyagi; Taketoshi Hibiya, Tokyo, both of Japan
[73] Assignee: NEC Corporation, Japan
[21] Appl. No.: 879,002
[22] Filed: Jun. 26, 1986
[30] Foreign Application Priority Data
Jun. 27, 1985 [JP] Japan .................................. 60-140973
[51] Int. Cl.$^4$ .......................... G02B 1/09; C04B 35/40; C04B 35/50
[52] U.S. Cl. ................................... 350/376; 252/62.57
[58] Field of Search .............................. 350/375–376; 252/62.57; 365/33

[56] References Cited
U.S. PATENT DOCUMENTS
4,544,438 10/1985 Luther et al. .................... 252/62.57

OTHER PUBLICATIONS
Takeuchi et al, "Faraday Effect of Bi-Substituted Rare-Earth Iron Garnet", Japan. J. Appl. Phys., 1973, p. 465.
Akselrad et al, "New Bi-Based Garnet Films for Magnetic-Bubble Devices with Magneto-Optic Applications", AIP Conf. Proc. #1B, p. 2, 1973, pp. 949–953.

Primary Examiner—William H. Punter
Attorney, Agent, or Firm—Laff, Whitesel, Conte & Saret

[57] ABSTRACT

A magnetooptic garnet single crystal film for use in a Faraday rotator is $Dy_{3-x}Bi_xFe_5O_{12}$ ($x=0.2-1$). The garnet has a reduced temperature characteristic of the Faraday rotation angle, to thereby insure a reliable and stabilized isolation against temperature variation.

4 Claims, 2 Drawing Sheets

MAGNETOOPTIC GARNET

BACKGROUND OF THE INVENTION

1. Field of the Invention

The present invention relates to magnetooptic garnets adaptable for use in Faraday rotators which are used in optical fiber transmission systems.

2. Description of the Prior Art

As disclosed in U.S. Pat. No. 4,522,473 granted to Hibiya et al, Faraday rotators are used as optical isolators, optical circulators, and optical switches in optical fiber transmission systems.

The Faraday rotator comprises a non-magnetic garnet substrate and a magnetooptic garnet film. The magnetooptic garnet is epitaxially grown on the substrate.

Recently, it has been proposed to use an epitaxially grown $(GdBi)_3(FeAlGa)_5O_{12}$ garnet as the magnetooptic garnet film of the Faraday rotator in order to reduce a cost of the Faraday rotator. A reference is made to a paper WK1 in Conference on Optical Fiber Communication held in San Diego, Calif., U.S.A. in February, 1985.

Faraday rotation coefficient of $(GdBi)_3(FeAlGa)_5O_{12}$ garnet has a large temperature characteristic and considerably varies in dependence on a circumference temperature. Even if an angle of Faraday rotation of a Faraday rotator is insured to be 45° angle at the room temperature which is necessary for use in an isolator, the Faraday rotation angle changes by the circumference temperature variation so that isolation is degraded.

SUMMARY OF THE INVENTION

It is an object of the present invention to provide magnetooptic garnet having a reduced temperature characteristic of the Faraday rotation coefficient for use in the 1.3 μm and 1.5 μm wavelength bands of electromagnetic waves, to thereby enable to provide an optical isolator having an isolation stabilized against temperature variation.

A magnetooptic garnet according to the present invention is a compound represented by a formula $Dy_{3-x}Bi_xFe_5O_{12}$ (x=0.2-1.0, preferably, x=0.2-0.7 and more preferably, x=0.25-0.6).

DETAILED DESCRIPTION OF PREFERRED EMBODIMENTS

Figure 1:
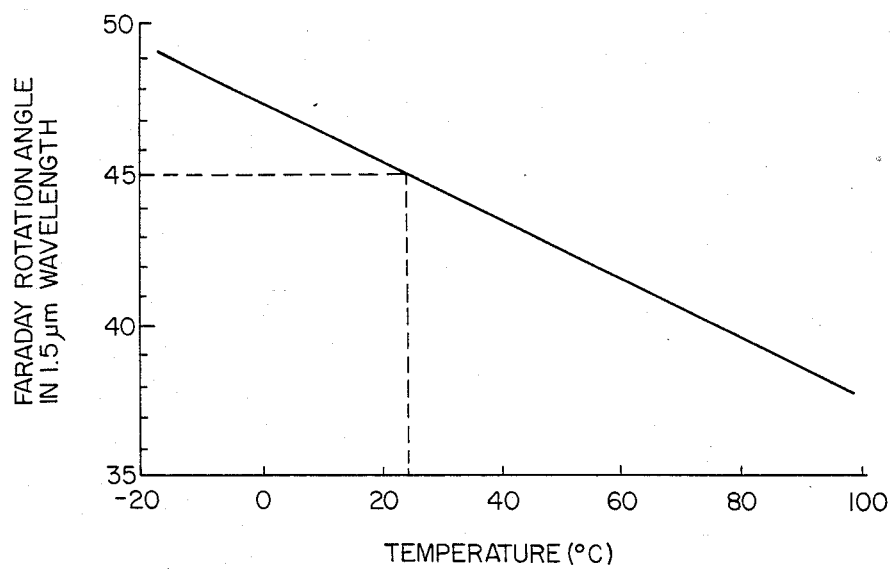
FIG. 1 is a graphical view for illustrating a relationship between the Faraday rotation angle of a known garnet of $(GdBi)_3(FeAlGa)_5O_{12}$ and the circumference temperature.
Figure 2:
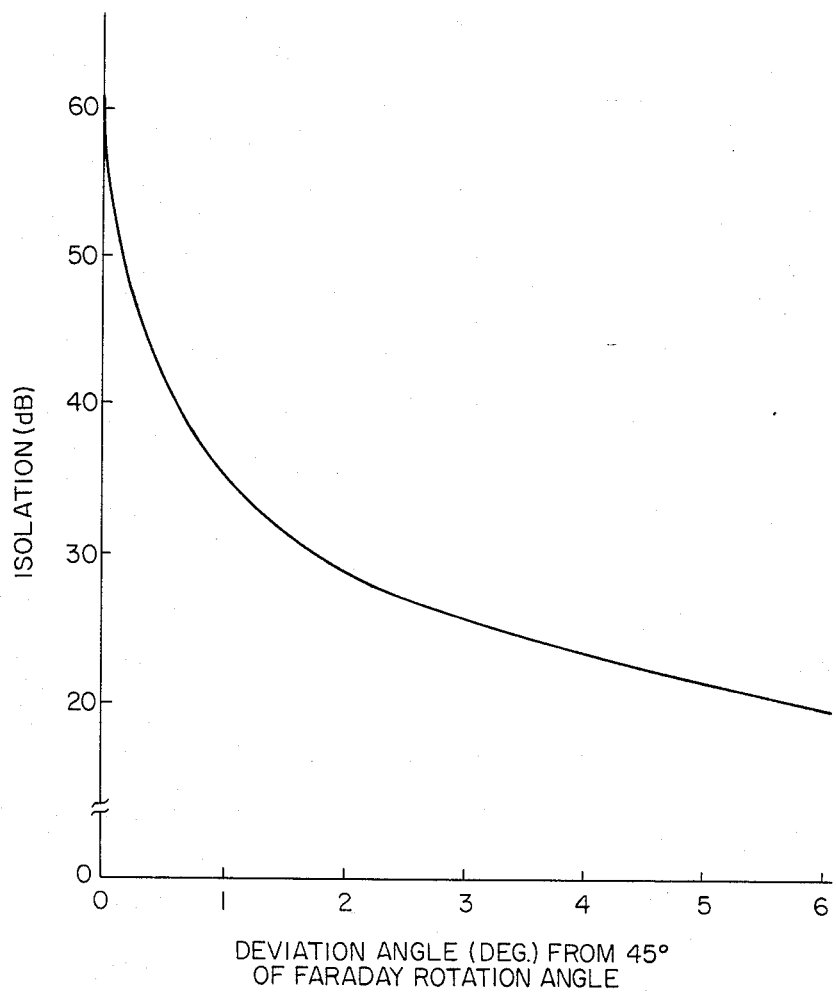
FIG. 2 is a graphical view for illustrating a relationship between the isolation and a deviation of the Faraday rotation angle from 45°.

Prior to description of examples of garnet of the present invention, the temperature characteristic of Faraday rotation of $(GdBi)_3(FeAlGa)_5O_{12}$ is explained referring to FIGS. 1 and 2.

Referring to FIG. 1, the Faraday rotation angle of a Faraday rotator using $(GdBi)_3(FeAlGa)_5O_{12}$ garnet film varies in response to temperature variation as shown in the figure, for use in the 1.5 μm wavelength band of the electromagnetic wave. Due to the variation of the Faraday rotation angle, isolation is lowered according to deviation from 45° of the Faraday rotation angle as shown in FIG. 2.

In this connection, isolation is defined by the following equation:

$$\text{Isolation} = -\log_{10} \sin^2 (\Delta\theta),$$

where $\Delta\theta$ is a deviation of the Faraday rotation angle from 45°.

The present invention attempts to provide a garnet having Bi ions and Dy ions at lattice sites represented by 24c in the garnet crystal whereby the temperature characteristic of Faraday rotation of the garnet is reduced. Thus, an optical isolator can be obtained with a stabilized operation even under a temperature variation.

Table 1 shows temperature characteristics of the Faraday rotation and isolation of six (6) garnets represented by $Dy_{3-x}Bi_xFe_5O_{12}$ for use in the 1.5 μm wavelength band.

Table 2 also shows similar properties of five (5) garnets represented by $Dy_{3-x}Bi_xFe_5O_{12}$ in 1.3 μm wavelength band.

TABLE 1

| Examples | Bi Contents (x) | Faraday Rotation Coefficient (deg/cm) | | | Variation of Faraday Rotation Coefficient (%) | Isolation at 50° C. (dB) |
| --- | --- | --- | --- | --- | --- | --- |
| | | 0° C. | 25° C. | 50° C. | | |
| 1 | 0.4 | −412 | −403 | −395 | −2.1 | 36 |
| 2 | 0.6 | −700 | −680 | −660 | −2.9 | 33 |
| 3 | 0.8 | −988 | −957 | −925 | −3.3 | 32 |
| 4 | 1.0 | −1277 | −1233 | −1190 | −3.5 | 31 |
| 5 | 0.2 | −123 | −127 | −130 | +2.6 | 34 |
| 6 | 0.3 | −268 | −265 | −264 | −0.9 | 43 |

For 1.5 μm wavelength light

TABLE 2

| Examples | Bi Contents (x) | Faraday Rotation Coefficient (deg/cm) | | | Variation of Faraday Rotation Coefficient (%) | Isolation at 50° C. (dB) |
| --- | --- | --- | --- | --- | --- | --- |
| | | 0° C. | 25° C. | 50° C. | | |
| 5 | 0.2 | −390 | −380 | −370 | +2.6 | 34 |
| 7 | 0.275 | −417 | −415 | −413 | +0.6 | 46 |
| 8 | 0.5 | −924 | −910 | −896 | −1.5 | 38 |
| 9 | 0.62 | −1157 | −1130 | −1105 | −2.2 | 35 |
| 4 | 1.0 | −1915 | −1850 | −1785 | −3.5 | 31 |

For 1.3 μm wavelength light

It will be understood from Tables 1 and 2, that the garnet $Dy_{3-x}Bi_xFe_5O_{12}$ has a reduced temperature characteristics of the Faraday rotation coefficient in comparison with the known garnet $(GdBi)_3(FeAlGa)_5O_{12}$ and provides an excellent isolation when x=0.2-1.0, preferably at Examples 1, 2, 5, 6, 7, 8, and 9, more preferably at Examples 1, 5, 6, 7, and 8.

EXAMPLE 1

A non-magnetic samarium-gallium garnet substrate was prepared which has a lattice constant of 12.438 Å and a surface of a crystallographic plane denoted by {111}. On the surface of the substrate, a film of magnetooptic single crystal garnet of $Dy_{2.6}Bi_{0.4}Fe_5O_{12}$, with a lattice constant of 12.436 Å was formed at 770° C. with a thickness of 1.1 mm by a liquid phase epitaxial technique using a flux comprising PbO, $Bi_2O_3$ and $B_2O_3$ in which $Fe_2O_3$ and $Dy_2O_3$ are melted in a platinum crucible, and a Faraday rotator element was formed.

Figure 3:
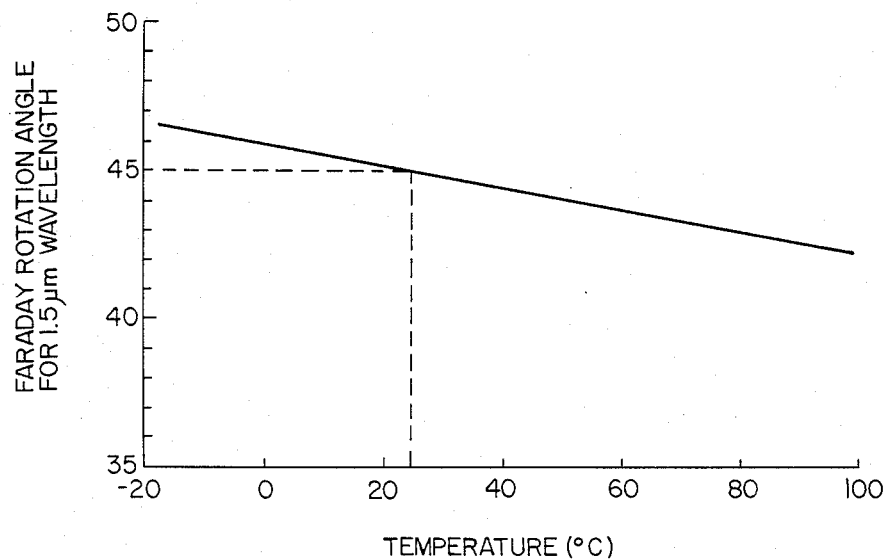
FIG. 3 is a graphical view for illustrating a relationship between the Faraday angle of Example 1 according to the present invention and the circumference temperature.

The Faraday rotation coefficient of the grown garnet film was measured at different temperatures including 0° C., 25° C., and 50° C., for the 1.5 μm wavelength light. The measured data are shown in Table 1. FIG. 3 also shows a relationship between the Faraday rotation angle and the temperature. The film has the Faraday rotation angle of 45° at a temperature of 25° C. as shown in FIG. 3. Variation rate of the Faraday rotation coefficient from 25° C. to 0° C. and 50° C. was only 2.1%. The variation rate is considerably low in comparison with a variation rate in $(GdBi)_3(FeAlGa)_5O_{12}$ which is about 4% as will be understood from FIG. 1.

Thus, isolation of about 35 dB was obtained over a temperature range of 0° C. to 50° C.

The isolation in use of the film was not degraded by instability of oscillating wavelength of a laser oscillator which is caused by circumference temperature variation. The film was appreciated to have an advantage for removal of a reflection noise.

EXAMPLE 2

A grown $Dy_{2.4}Bi_{0.6}Fe_5O_{12}$ magnetooptic garnet film having a thickness of 662 μm and a lattice constant of 12.442 Å was formed at a temperature of 764° C. on a substrate similar to Example 1.

The Faraday rotation coefficient of the formed film for 1.5 μm wavelength light was measured at 0° C., 25° C., and 50° C., and the measured data are shown in Table 1. The Faraday rotation angle of 45° was obtained at the thickness of 662 μm at 25° C.

In comparison with the Faraday rotation coefficient at 25° C., variation rates at 0° C. and 50° C. is about only 2.9%. This is also lower than that in $(GdBi)_3(FeAlGa)_5O_{12}$.

The use of the film achieved isolation of about 33 dB in a temperature range from 0° C. to 50° C.

EXAMPLE 3

A film of $Dy_{2.2}Bi_{0.8}Fe_5O_{12}$ single crystal garnet was liquid-phase epitaxially grown at 752° C. on a substrate similar to Example 1. The grown garnet film has a lattice constant of 12.444 Å and a thickness of 470 μm.

The Faraday rotation coefficient of the film as measured for 1.5 μm wavelength light is disclosed in Table 1 for different temperatures. The Faraday rotation of 45° at 25° C. was obtained at the thickness of 470 μm.

The variation rates of the Faraday rotation coefficient at 0° C. and 50° C. in comparison with 25° C. were calculated about 3.3% which was lower than about 4% in $(GdBi)_3(FeAlGa)_5O_{12}$.

Isolation of about 32 dB was obtained over a temperature range from 0° C. to 50° C.

EXAMPLE 4

A grown $Dy_{2.0}Bi_{1.0}Fe_5O_{12}$ single crystal garnet film having a lattice constant of 12.449 Å, was formed at 812° C. on a similar substrate in Example 1.

The Faraday rotation coefficient of the film having a thickness of 365 μm for 1.5 μm wavelength light were measured as shown in Table 1. The film of the thickness of 365 μm has the Faraday rotation angle of 45° at 25° C.

In comparison with the Faraday rotation coefficient at 25° C., the variation rate of about 3.5% was calculated at 0° C. and 50° C., and is lower than 4% in $(GdBi)_3(FeAlGa)_5O_{12}$.

Over a temperature range from 0° C. to 50° C., a constant isolation of about 31 dB could be obtained.

For 1.3 μm wavelength light, the Faraday rotation coefficient of the film having a different thickness of 243 μm were measured as shown in Table 2, and the Faraday rotation angle of 45° was obtained at 25° C. The variation rate of the Faraday rotation from 25° C. to 0° C. or 50° C. was about only 3.5% as disclosed in Table 2.

EXAMPLE 5

A single crystal garnet film of $Dy_{2.8}Bi_{0.2}Fe_5O_{12}$ having a lattice constant of 12.420 Å was liquid-phase epitaxially grown at 712° C. on a similar substrate as in Example 1.

The Faraday rotation coefficient of the grown film of a 3.52 mm thickness was measured at different temperature for 1.5 μm wavelength light. The measured data are demonstrated in Table 1. The Faraday rotation angle of 45° at 25° C. was obtained at the thickness of 3.52 mm.

In comparison with the Faraday rotation coefficient at 25° C., those at 0° C. and 50° C. have a variation of only about 2.6%, which is lower than 4% in $(GdBi)_3(FeAlGa)_5O_{12}$.

The film achieved a constant isolation of about 33 dB over a temperature range of 0° C. to 50° C.

The Faraday rotation coefficient of the film having a thickness of 1.184 mm for 1.3 μm wavelength light was shown in Table 2 for different temperature. The variation of the Faraday rotation coefficient at 0° C. or 50° C. in comparison with 25° C. is about 2.6%.

EXAMPLE 6

A grown $Dy_{2.7}Bi_{0.3}Fe_5O_{12}$ magnetooptic garnet film having a thickness of 1.69 mm and a lattice constant of 12.428 Å was formed at a temperature of 727° C. on a substrate similar to Example 1.

The Faraday rotation coefficient of the formed film for 1.5 μm wavelength light was measured at 0° C., 25° C., and 50° C., and the measured data are shown in Table 1. The Faraday rotation angle of 45° was obtained at the thickness of 1.69 mm at 25° C.

In comparison with the Faraday rotation coefficient at 25° C., variation rates at 0° C. and 50° C. is about only 0.9%. This is also lower than that in $(GdBi)_3(FeAlGa)_5O_{12}$.

The use of the film achieved isolation of about 43 dB in a temperature range from 0° C. to 50° C.

EXAMPLE 7

A film of $Dy_{2.725}Bi_{0.275}Fe_5O_{12}$ single crystal garnet was liquid-phase epitaxially grown at 736° C. on a substrate similar to Example 1. The grown garnet film has a lattice constant of 12.424 Å and a thickness of 1.084 mm.

The Faraday rotation coefficient of the film as measured for 1.3 μm wavelength light is disclosed in Table 2 for different temperatures. The Faraday rotation of 45° at 25° C. was obtained at the thickness of 1.084 mm.

The variation rates of the Faraday rotation coefficient at 0° C. and 50° C. in comparison with 25° C. were calculated about 0.6% which was lower than about 4% in $(GdBi)_3(FeAlGa)_5O_{12}$.

A constant isolation of about 46 dB was obtained over a temperature range from 0° C. to 50° C.

EXAMPLE 8

A grown $Dy_{2.5}Bi_{0.5}Fe_5O_{12}$ single crystal garnet film having a lattice constant of 12.439 Å, was formed at 813° C. on a similar substrate in Example 1.

The Faraday rotation coefficient of the film having a thickness of 495 μm for 1.3 μm wavelength light were measured as shown in Table 2. The film of the thickness of 495 μm has the Faraday rotation angle of 45° at 25° C.

In comparison with the Faraday rotation coefficient at 25° C., the variation rate of about 1.5% was calculated at 0° C. and 50° C., and is lower than 4% in $(GdBi)_3(FeAlGa)_5O_{12}$.

Over a temperature range from 0° C. to 50° C., a constant isolation of about 38 dB could be obtained.

EXAMPLE 9

A single crystal garnet film of $Dy_{2.38}Bi_{0.62}Fe_5O_{12}$ having a lattice constant of 12.443 Å was liquid-phase epitaxially grown at 712° C. on a similar substrate as in Example 1.

The Faraday rotation coefficient of the grown film of a 398 μm thickness was measured at different temperature for 1.3 μm wavelength light. The measured data are demonstrated in Table 2. The Faraday rotation angle of 45° to 25° C. was obtained at the thickness of 398 μm.

In comparison with the Faraday rotation coefficient at 25° C., those at 0° C. and 50° C. have a variation of only about 2.2%, which is lower than 4% in $(GdBi)_3(FeAlGa)_5O_{12}$.

The film achieved a constant isolation of about 35 dB over a temperature range of 0° C. to 50° C.

What is claimed is:

1. A magnetooptic single crystal garnet characterized by a composition represented by a formula $Dy_{3-x}Bi_x Fe_5O_{12}$, where x=0.2–0.7, said crystal having a reduced temperature characteristic of the Faraday rotation coefficient.

2. A magnetooptic single crystal garnet as claimed in claim 1, wherein x=0.2–0.7.

3. A magnetooptic single crystal garnet as claimed in claim 2, wherein x=0.25–0.6.

4. An optical Faraday rotator comprising a non-magnetic garnet substrate and a magnetooptic single crystal garnet film formed on said substrate by the liquid-phase epitaxial technique, wherein said film is made of said magnetooptic single crystal garnet as claimed in claim 1, said optical Faraday rotator having a Faraday rotation angle which is stabilized against temperature variations.

* * * * *